(12) United States Patent
Nishiya et al.

(10) Patent No.: US 6,373,407 B1
(45) Date of Patent: Apr. 16, 2002

(54) DATA ENCODING METHOD FOR DIGITAL DATA RECORDING AND DATA RECORDING SYSTEM USING THE SAME

(75) Inventors: Takushi Nishiya, Machida; Tatsuya Hirai, Yokohama; Seiichi Mita, Kanagawa-ken; Takashi Nara, Takasaki; Yoichi Uehara, Maebashi; Hiroshi Ide, Takasaki; Kyoko Tsukano, Kumamoto; Yoshiju Watanabe, Kanagawa-ken, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/255,733

(22) Filed: Feb. 23, 1999

(30) Foreign Application Priority Data

Feb. 25, 1998 (JP) .......................................... 10-043186

(51) Int. Cl.[7] .............................................. H03M 7/00
(52) U.S. Cl. .......................................... 341/59; 341/58
(58) Field of Search ............................ 341/58, 59, 67, 341/50; 7114/795

(56) References Cited

U.S. PATENT DOCUMENTS

| | | | | |
|---|---|---|---|---|
| 5,008,669 A | * | 4/1991 | Ishibashi et al. | 341/102 |
| 5,635,933 A | * | 6/1997 | Fitzpatrick et al. | 341/58 |
| 5,717,395 A | | 2/1998 | Zook | 341/59 |
| 5,731,768 A | * | 3/1998 | Tsang | 341/59 |
| 5,748,119 A | * | 5/1998 | Ko | 341/59 |
| 5,781,133 A | * | 7/1998 | Tsang | 341/59 |
| 5,784,010 A | * | 7/1998 | Coker et al. | 341/61 |
| 5,859,601 A | * | 1/1999 | Moon et al. | 341/59 |
| 5,892,467 A | * | 4/1999 | Kim | 341/59 |
| 5,933,103 A | * | 8/1999 | Kim | 341/59 |
| 6,188,335 B1 | * | 2/2001 | Roth et al. | 341/59 |

OTHER PUBLICATIONS

"A PRML (Partial Response Maximum Likelihood) System for Digital Magnetic Recording", IEEE J. Select. Area Commun., vol. 10, No. 1, Jan. 1992, R.D. Cideciyam et al, pp. 38–56.

Proc. of Globecom 97, "Time–Varying MTR Codes for High Density Magnetic Recording", K.K. Fitzpatrick, pp. 1250–1253.

* cited by examiner

*Primary Examiner*—Peguy JeanPierre
(74) *Attorney, Agent, or Firm*—Mattingly, Stanger & Malur, P.C.

(57) ABSTRACT

The computer system includes a host system, a recording medium, and a digital signal decoder connected to the host system and the recording medium. The digital signal decoder receives M-bit data and generates an N-bit code word from the M-bit data. The number of consecutive bits of 1 in the code word is not larger than a first predetermined number K, and the number of consecutive bits of 0 is not larger than a second predetermined number L. When data is recorded/reproduced by a method such as NRZI (Non-Return to Zero Inverted), or the like, there is a defect in that the number of transitions of data is larger in a code with a high data encoding rate, and the run length of zero is long thereby increasing the data decoding error rate with the recording/reproducing of data. In the digital signal decoder according to the present invention, any code word includes at most 3 consecutive bits of 1, and at most 11 consecutive bits of 0, so that the data decoding error rate can be reduced.

5 Claims, 11 Drawing Sheets

FIG. IA
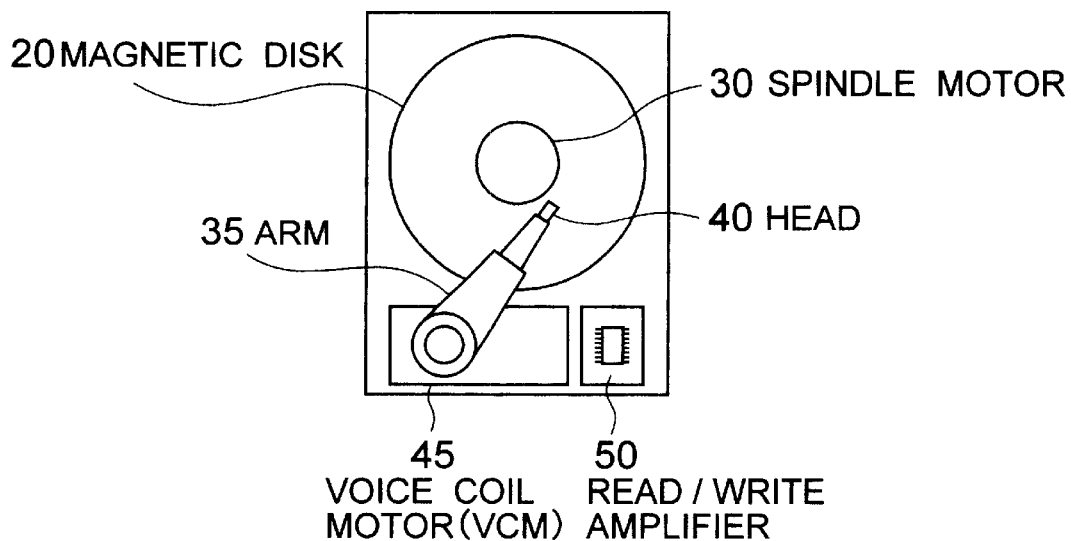
10 MAGNETIC RECORDING SYSTEM INTERIOR
20 MAGNETIC DISK
30 SPINDLE MOTOR
35 ARM
40 HEAD
45 VOICE COIL MOTOR (VCM)
50 READ / WRITE AMPLIFIER
FIG. IB
60 MAGNETIC RECORDING SYSTEM ELECTRONIC CIRCUIT PORTION
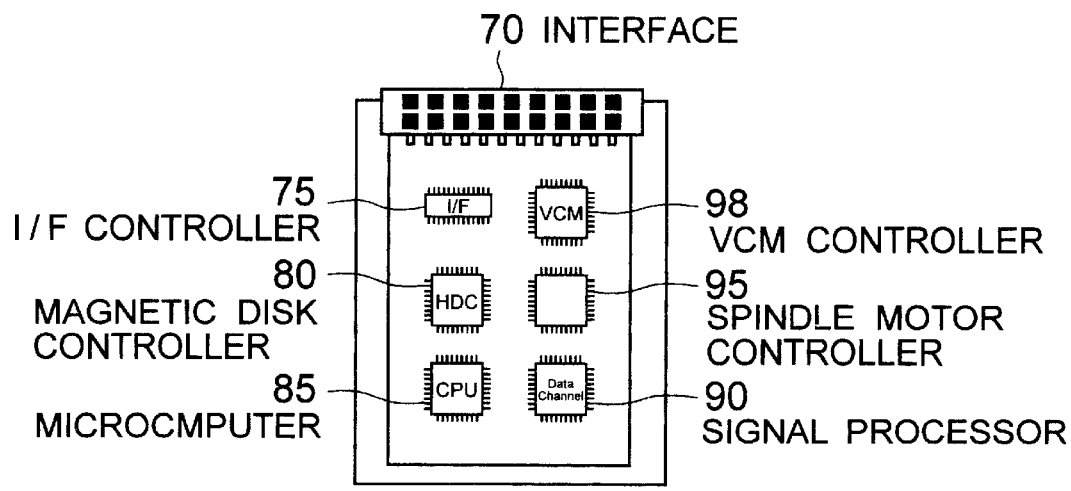
70 INTERFACE
75 I/F CONTROLLER
98 VCM CONTROLLER
80 MAGNETIC DISK CONTROLLER
95 SPINDLE MOTOR CONTROLLER
85 MICROCMPUTER
90 SIGNAL PROCESSOR

FIG. 3

| | | | | | | | |
|---|---|---|---|---|---|---|---|
| 0, | 1, | 2, | 3, | 4, | 5, | 6, | 8, |
| 9, | 10, | 11, | 12, | 13, | 14, | 16, | 17, |
| 18, | 19, | 20, | 21, | 22, | 24, | 25, | 26, |
| 27, | 28, | 29, | 32, | 33, | 34, | 35, | 36, |
| 37, | 38, | 40, | 41, | 42, | 43, | 44, | 45, |
| 46, | 49, | 49, | 50, | 51, | 52, | 53, | 54, |
| 56, | 57, | 58, | 59, | 64, | 65, | 66, | 67, |
| 68, | 69, | 70, | 72, | 73, | 74, | 75, | 76, |
| 77, | 78, | 80, | 81, | 82, | 83, | 84, | 85, |
| 86, | 88, | 89, | 90, | 91, | 92, | 93, | 96, |
| 97, | 98, | 99, | 100, | 101, | 102, | 104, | 105, |
| 106, | 107, | 108, | 109, | 110, | 112, | 113, | 114, |
| 115, | 116, | 117, | 118, | 128, | 129, | 130, | 131, |
| 132, | 133, | 134, | 136, | 137, | 138, | 139, | 140, |
| 141, | 142, | 144, | 145, | 146, | 147, | 148, | 149, |
| 150, | 152, | 153, | 154, | 155, | 156, | 157, | 160, |
| 161, | 162, | 163, | 164, | 165, | 166, | 168, | 169, |
| 170, | 171, | 172, | 173, | 174, | 176, | 177, | 178, |
| 179, | 180, | 181, | 182, | 184, | 185, | 186, | 187, |
| 192, | 193, | 194, | 195, | 196, | 197, | 198, | 200, |
| 201, | 202, | 203, | 204, | 205, | 206, | 208, | 209, |
| 210, | 211, | 212, | 213, | 214, | 216, | 217, | 218, |
| 219, | 220, | 221, | 224, | 225, | 226, | 227, | 228, |
| 229, | 230, | 232, | 233, | 234, | 235, | 236, | 237, |
| 238 | | | | | | | |

FIG. 5

| | USER DATA | | y0 | CENTER BIT | y1 | NOTE |
|---|---|---|---|---|---|---|
| | x0 | x1 | | | | |
| 1 | x0<186 | x1<186 | +7 | 0 | +7 | (a) |
| 2 | 186≦x0 | 186≦x1 | −104 | 1 | −104 | (f) |
| 3 | 186≦x0 | 104≦x1<186 | −104 | 1 | −104 | (f) |
| 4 | 104≦x0<186 | 186≦x1 | −104 | 1 | −104 | (f) |
| 5 | x0<100 | 186≦x1<213 | 0 | 1 | −34 | (g) |
| 6 | 186≦x0<213 | x1<100 | −34 | 1 | 0 | (g) |
| 7 | x0<41 | 213≦x1<254 | 0 | 1 | −213 | (f) |
| 8 | 41≦x0<82 | 213≦x1<254 | 0 | 1 | −213 | (f) |
| 9 | 213≦x0<254 | x1<41 | −213 | 1 | +41 | (f) |
| 10 | 213≦x0<254 | 41≦x1<82 | −172 | 1 | 0 | (f) |
| 11 | x0<82 | x1=254 | +27 | 0 | −253 | (c) |
| 12 | x0<82 | x1=255 | +109 | 0 | −254 | (c) |
| 13 | x0=254 | x1<82 | −253 | 0 | +27 | (c) |
| 14 | x0=255 | x1<82 | −254 | 0 | +109 | (c) |
| 15 | 94≦x0<96 | 213≦x1 | −92 | 0 | −199 | (d) |
| 16 | 96≦x0<98 | 213≦x1 | −94 | 0 | −156 | (d) |
| 17 | 98≦x0<100 | 213≦x1 | −96 | 0 | −113 | (d) |
| 18 | 100≦x0<102 | 186≦x1<236 | −98 | 0 | −43 | (d) |
| 19 | 213≦x0 | 94≦x1<96 | −199 | 0 | −92 | (d) |
| 20 | 213≦x0 | 96≦x1<98 | −156 | 0 | −94 | (d) |
| 21 | 213≦x0 | 98≦x1<100 | −113 | 0 | −96 | (d) |
| 22 | 186≦x0<236 | 100≦x1<102 | −43 | 0 | −98 | (d) |
| 23 | 100≦x0<102 | 236≦x1<250 | −96 | 0 | −57 | (e) |
| 24 | x0=100 | 250≦x1 | −94 | 0 | −71 | (e) |
| 25 | x0=101 | 250≦x1 | −95 | 0 | −65 | (e) |
| 26 | x0=102 | 186≦x1 | −102 | 0 | −134 | (b) |
| 27 | x0=103 | 186≦x1 | −103 | 0 | −64 | (b) |
| 28 | 236≦x0<250 | 100≦x1<102 | −57 | 0 | −96 | (e) |
| 29 | 250≦x0 | x1=100 | −71 | 0 | −94 | (e) |
| 30 | 250≦x0 | x1=101 | −65 | 0 | −95 | (e) |
| 31 | 186≦x0 | x1=102 | −134 | 0 | −102 | (b) |
| 32 | 186≦x0 | x1=103 | −64 | 0 | −103 | (b) |
| 33 | 82≦x0<85 | 213≦x1 | −78 | 0 | −206 | (e) |
| 34 | 85≦x0<88 | 213≦x1 | −81 | 0 | −163 | (e) |
| 35 | 88≦x0<91 | 213≦x1 | −84 | 0 | −120 | (e) |
| 36 | 91≦x0<94 | 213≦x1 | −87 | 0 | −77 | (e) |
| 37 | 213≦x0 | 82≦x1<85 | −206 | 0 | −78 | (e) |
| 38 | 213≦x0 | 85≦x1<88 | −163 | 0 | −81 | (e) |
| 39 | 213≦x0 | 88≦x1<91 | −120 | 0 | −84 | (e) |
| 40 | 213≦x0 | 91≦x1<94 | −77 | 0 | −87 | (e) |

FIG. 7

| | | | | | | | |
|---|---|---|---|---|---|---|---|
| 0. | 1, | 2, | 3, | 4, | 5, | 6, | 255, |
| 7. | 8, | 9, | 10, | 11, | 12, | 13, | 255, |
| 14. | 15, | 16, | 17, | 18, | 19, | 20, | 255, |
| 21, | 22, | 23, | 24, | 25, | 26, | 255, | 255, |
| 27, | 28, | 29, | 30, | 31, | 32, | 33, | 255, |
| 34, | 35, | 36, | 37, | 38, | 39, | 40, | 255, |
| 41, | 42, | 43, | 44, | 45, | 46, | 47, | 255, |
| 48, | 49, | 50, | 51, | 255, | 255, | 255, | 255, |
| 52, | 53, | 54, | 55, | 56, | 57, | 58, | 255, |
| 59, | 60, | 61, | 62, | 63, | 64, | 65, | 255, |
| 66, | 67, | 68, | 69, | 70, | 71, | 72, | 255, |
| 73, | 74, | 75, | 76, | 77, | 78, | 255, | 255, |
| 79, | 80, | 81, | 82, | 83, | 84, | 85, | 255, |
| 86, | 87, | 88, | 89, | 90, | 91, | 92, | 255, |
| 93, | 94, | 95, | 96, | 97, | 98, | 99, | 255, |
| 255, | 255, | 255, | 255, | 255, | 255, | 255, | 255, |
| 100, | 101, | 102, | 103, | 104, | 105, | 106, | 255, |
| 107, | 108, | 109, | 110, | 111, | 112, | 113, | 255, |
| 114, | 115, | 116, | 117, | 118, | 119, | 120, | 255, |
| 121, | 122, | 123, | 124, | 125, | 126, | 255, | 255, |
| 127, | 128, | 129, | 130, | 131, | 132, | 133, | 255, |
| 134, | 135, | 136, | 137, | 138, | 139, | 140, | 255, |
| 141, | 142, | 143, | 144, | 145, | 146, | 147, | 255, |
| 148, | 149, | 150, | 151, | 255, | 255, | 255, | 255, |
| 152, | 153, | 154, | 155, | 156, | 157, | 158, | 255, |
| 159, | 160, | 161, | 162, | 163, | 164, | 165, | 255, |
| 166, | 167, | 168, | 169, | 170, | 171, | 172, | 255, |
| 173, | 174, | 175, | 176, | 177, | 178, | 255, | 255, |
| 179, | 180 | 181, | 182, | 183, | 184, | 185, | 255, |
| 186, | 187, | 188, | 189, | 190, | 191, | 192, | 255, |
| 255, | 255, | 255, | 255, | 255, | 255, | 255, | 255, |
| 255, | 255, | 255, | 255, | 255, | 255, | 255, | 255, |

FIG. 8

| | DECODING RESULT | | | CORRECTION VALUE | | NOTE |
|---|---|---|---|---|---|---|
| | $z_0$ | CENTER BIT | $z_1$ | $r_0$ | $r_1$ | |
| 1 | $z_0 > 7$ | 0 | $z_1 > 7$ | −7 | −7 | |
| 2 | $82 \leq z_0 < 152$ | 1 | $82 \leq z_1 < 152$ | +104 | +104 | |
| 3 | $82 \leq z_0 < 152$ | 1 | $z_1 < 82$ | +104 | +104 | |
| 4 | $z_0 < 82$ | 1 | $82 \leq z_1 < 152$ | +104 | +104 | |
| 5 | $z_0 < 100$ | 1 | $152 \leq z_1 < 179$ | 0 | +34 | |
| 6 | $152 \leq z_0 < 179$ | 1 | $z_1 < 100$ | +34 | 0 | |
| 7 | $z_0 < 41$ | 1 | $z_1 < 41$ | 0 | +213 | |
| 8 | $41 \leq z_0 < 82$ | 1 | $z_1 < 41$ | 0 | +213 | |
| 9 | $z_0 < 41$ | 1 | $41 \leq z_1 < 41$ | +213 | −41 | |
| 10 | $41 \leq z_0 < 82$ | 1 | $41 \leq z_1 < 82$ | +172 | 0 | |
| 11 | $27 \leq z_0 < 109$ | 0 | $z_1 = 1$ | −27 | +253 | |
| 12 | $109 \leq z_0 < 191$ | 0 | $z_1 = 1$ | −109 | +254 | |
| 13 | $z_0 = 1$ | 0 | $27 \leq x_1 < 109$ | +253 | −27 | |
| 14 | $z_0 = 1$ | 0 | $109 \leq z < 82$ | +254 | −109 | |
| 15 | $2 \leq z_0 < 4$ | 0 | $14 \leq z_1 < 57$ | +92 | +199 | |
| 16 | $2 \leq z_0 < 4$ | 0 | $57 \leq z_1 < 100$ | +94 | +156 | |
| 17 | $2 \leq z_0 < 4$ | 0 | $100 \leq z_1 < 143$ | +96 | +113 | |
| 18 | $2 \leq z_0 < 4$ | 0 | $143 \leq z_1 < 193$ | +98 | +43 | |
| 19 | $14 \leq z_0 < 57$ | 0 | $2 \leq z_1 < 4$ | +199 | +92 | |
| 20 | $57 \leq z_0 < 100$ | 0 | $2 \leq z_1 < 4$ | +156 | +94 | |
| 21 | $100 \leq z_0 < 143$ | 0 | $2 \leq z_1 < 4$ | +113 | +96 | |
| 22 | $143 \leq z_0 < 193$ | 0 | $2 \leq z_1 < 4$ | +43 | +98 | |
| 23 | $4 \leq z_0 < 6$ | 0 | $179 \leq z_1 < 193$ | +96 | +57 | |
| 24 | $z_0 = 6$ | 0 | $179 \leq z_1 < 185$ | +94 | +71 | |
| 25 | $z_0 = 6$ | 0 | $185 \leq z_1 < 191$ | +95 | +65 | |
| 26 | $z_0 = 0$ | 0 | $52 \leq z_1 < 122$ | +102 | +134 | |
| 27 | $z_0 = 0$ | 0 | $122 \leq z_1 < 192$ | +103 | +64 | |
| 28 | $179 \leq z_0 < 193$ | 0 | $4 \leq z_1 < 6$ | +57 | +96 | |
| 29 | $179 \leq z_0 < 185$ | 0 | $x_1 = 6$ | +71 | +94 | |
| 30 | $185 \leq x_0 < 191$ | 0 | $z_1 = 6$ | +65 | +95 | |
| 31 | $52 \leq z_0 < 122$ | 0 | $z_1 = 0$ | +134 | +102 | |
| 32 | $122 \leq z_0 < 192$ | 0 | $z_1 = 0$ | +64 | +103 | |
| 33 | $4 \leq z_0 < 7$ | 0 | $7 \leq z_1 < 50$ | +78 | +206 | |
| 34 | $4 \leq z_0 < 7$ | 0 | $50 \leq z_1 < 93$ | +81 | +163 | |
| 35 | $4 \leq z_0 < 7$ | 0 | $93 \leq z_1 < 136$ | +84 | +120 | |
| 36 | $4 \leq z_0 < 7$ | 0 | $136 \leq z_1 < 179$ | +87 | +77 | |
| 37 | $7 \leq z_0 < 50$ | 0 | $4 \leq z_1 < 7$ | +206 | +78 | |
| 38 | $50 \leq z_0 < 93$ | 0 | $4 \leq z_1 < 7$ | +163 | +81 | |
| 39 | $93 \leq z_0 < 136$ | 0 | $4 \leq z_1 < 7$ | +120 | +84 | |
| 40 | $136 \leq z_0 < 179$ | 0 | $4 \leq z_1 < 7$ | +77 | +87 | |

| EUCLIDIAN DISTANECE | ERROR PATTERN |
|---|---|
| 6 | +−+ |
| 8 | +−+00+−+<br>+−(+−)<br>+−+(−+) |

| Error Event | | Euclidian Distance | RLL(0.6/6) 16/17 | MTR 16/17 |
|---|---|---|---|---|
| a | + | 10 | 1.000 | 0.751 |
| b | +− | 12 | 0.437 | 0.273 |
| c | +0+ | 12 | 0.447 | 0.396 |
| d | +−+ | 6 | 0.160 | 0.0416 |
| e | +−+− | 8 | 0.0401 | 0.0 |
| f | +00+ | 12 | 0.517 | 0.454 |
| g | +−+−+ | 8 | 0.0 | 0.0 |
| h | +−+−+− | 8 | 0.0 | 0.0 |
| i | +−+00+ | 10 | 0.0763 | 0.0231 |
| j | +00+−+ | 10 | 0.0763 | 0.0115 |
| k | +−+0−+− | 10 | 0.0164 | 0.00136 |
| l | +−+−+−+ | 8 | 0.0 | 0.0 |

DATA ENCODING METHOD FOR DIGITAL DATA RECORDING AND DATA RECORDING SYSTEM USING THE SAME

BACKGROUND OF THE INVENTION

1. Field of the Invention

The present invention relates to a system for encoding data, recording the encoded data, reproducing the recorded data, and decoding the reproduced data, and particularly relates to a method and a circuit for encoding and decoding data.

2. Description of the Related Art

The present invention relates to a data encoding method, a data decoding method and a circuit therefor. According to this method and circuit, errors in decoding data from read-back signals can be reduced when data to be recorded is converted into codes in an apparatus for encoding data. The method includes the steps of recording the encoded data, reproducing the recorded data, and decoding the reproduced data in a recording system.

For a better appreciation of the invention, the related art will be briefly described, including description about Viterbi decoding, Trellis representation, and partial response channels. Description will be made about a magnetic recording channel by way of example. The frequency response of a magnetic response channel is similar to that in which a differentiator and a low-pass filter are connected in series, as described in R. D. Cideciyan, F. Dolivo, R. Hermann, W. Hirt, and W. Schott, "A PRML (Partial Response Maximum Likelihood) System for Digital Magnetic Recording", IEEE J. Select. Area Commun., Vol. 10, No. 1, pp. 38–56, January 1992. In addition, a magnetic recording channel is modeled as a partial response channel in which inter-symbol interference has an impulse response of $(1-D)(1+D)^n$ (the $n^{th}$ power of $(1+D)$) ($n=1,2,3\ldots$) where D represents a delay operator of one period. In any channel where inter-symbol interference can be modeled by $(1-D)(1+D)$, binary codes of 1 and 0 (or more generally +a and −a) are made into ternary outputs of +1, 0 and −1 (or +c, 0 and −c).

In addition, any channel where impulse response can be modeled by $(1-D)(1+D)^2$ is referred to as PR4 or EPR4, and binary codes of 1 and 0 (or more generally +a and −a) are made into quinary outputs of +2, +1, 0, −1 and −2 (or +2c, +c, 0, −c and −2c). Further, any channel where impulse response can be modeled by $(1-D)(1+D)^3$ is referred to as extended EPR4 or EEPR4, and binary codes of 1 and 0 (or more generally +a and −a) are made into septenary outputs of +3, +2, +1, 0, −1, −2 and −3 (or +3c, +2c, +c, 0, −c, −2c and −3c).

Thus, binary codes are converted into ternary, quinary or septenary signals in any magnetic recording channel. Viterbi decoding is performed so as to generate binary codes of 1 and 0 from such a sequence of ternary, quinary or septenary signals.

Viterbi decoding can be represented as a desired finite state machine having N states (N is the m-$^{th}$ power of 2 when the memory length of an encoder for convolutional codes is m). The form of a two-dimensional graph in which the (N) states of this finite state machine at a certain time k are expressed by nodes arranged vertically, and transitions from respective states to respective state at time (k+1) are represented as branches, is referred to as a trellis diagram.

Viterbi decoding is used for detecting the shortest path on the trellis diagram, and it is regarded as equivalent to a dynamic programming problem for a multistage decision process. A Viterbi decoder is used for maximum likelihood estimation of a transmission sequence in a channel having a band limit with inter-symbol interference. That is, of possible data symbol sequences, a data symbol sequence which can minimize a distance metric (distance function) for a received data symbol sequence, such as the total sum of square errors in the received data symbol sequence, or the like, is selected.

A data symbol for limiting the run length of "0" corresponding to silence has been conventionally used for recovering timing from read-back signals. Particularly, a rate 8/9 (0, 4/4) code, or a rate 16/17 (0, 6/6) code disclosed in U.S. Pat. No. 5,717,395 has been generally used as an RLL (Run Length Limited) (0, G/I) code suitable to the PR4 system and subject to an interleaving process. Here, G designates a global run length, and I designates a run length when interleaving is given to an even bit string and an odd bit string.

Signal processing systems are in the process of changing from PR4 systems to EPR4 systems in accordance with increase of the half-width (PW50/T) of waveform caused by the desire for high recording density. Recently, EEPR4 systems which are further extended EPR4 systems have come under consideration. According to the EPR4 systems, S/N gain of about 3.0 dB can be obtained in comparison with the PR4 systems. On the other hand, it is known that S/N gain cannot be obtained in EEPR4 systems if recording density is not so high, because the correlation with noise is increased by equalization.

The performance of Viterbi decoding systems is dominated by Euclidian distance between noiseless data symbol sequences. The distance between data symbols can be expanded by eliminating data symbols corresponding to dominant decoding error events from the data symbol sequences. However, the data decoding performance is dominated by the difference between the distance between data symbols and the loss caused by the reduction of the data encoding rate.

As for the system for expanding the distance between data symbols, a great amount of research is being directed to MTR (Maximum Transition Run) codes which can be expected to improve the performance on a large scale in cooperation with the EEPRML system. MTR codes restrict the number of consecutive magnetic transitions to thereby expand the minimum Euclidian distance between data symbols, and hence reduce the decoding error rate. To expand the Euclidian distance corresponds to cutting of a path which is not in existence as a symbol on the trellis diagram for Viterbi decoding. Therefore, the expansion of the Euclidian distance is more effective if the bit length taken account of in path selection is made longer. This is the reason why the effect of the MTR codes becomes conspicuous in the EEPRML system.

However, poor rate in data encoding is a drawback of the MTR codes. There has been proposed an MTR code overcoming this drawback and having a high rate of data encoding. As for an MTR code which restricts the number of consecutive magnetic transitions to at most two, a rate 6/7 MTR code by Brickner et al. is known. When an MTR code is used in the EEPRML system, the minimum Euclidian distance is expanded from 6 to 10, so that a coding gain of 2.2 dB can be obtained theoretically. Therefore, even if at most three consecutive magnetic transitions is allowed, similar improvement of the data decoding error rate can be expected with data symbols being arranged so that the minimum Euclidian distance is 10 on the trellis diagram of the EEPRML system. Such Generalized MTR codes have been proposed. As for the GMTR codes, known is a rate 8/9 GMTR code by Bliss, or a rate 9/10 GMTR code described in K. K. Fitzpatrick and C. S. Modlin, "Time-Varrying MTR Codes for High Density Magnetic Recording", Proc. of GLOBECOM 97, pp. 1250–1253, 1997. GMTR has the maximum data encoding rate (Shannon Capacity) C=0.925, and there remains a problem that there is no code the data encoding rate of which is beyond 12/13. The present invention relates to a code the data encoding rate of which is 16/17, so that the length of any independent error can be limited to 4 bits or less, by using the characteristic of MTR codes which can restrict the pattern of error events.

SUMMARY OF THE INVENTION

It is an object of the present invention to provide a recording code in which the inter-symbol distance is large, the data encoding rate is high, and the number of consecutive 0 bits (run length) is short, and hence to provide a recording system with a low data decoding error rate.

The above object of the present invention is attained, according to one aspect of the present invention, by performing recording/reproducing by use of a code in which the inter-symbol distance is large and the run length is short. That is, when M bits of data are encoded and recorded into N bits of data, the number of consecutive 1 bits included in code words is made to be not larger than a predetermined number K to thereby expand the average inter-symbol distance in random data. Further, the consecutive 0 bit number L is restricted, so that it is possible to avoid the influence of read-back signals on the timing of data sampling. Particularly, according to the present invention, it is possible to constitute code words in which K is 3 and L is 10 when M is 16 and N is 17, so that it is possible to obtain data symbols with a high data encoding rate.

A data encoding method and a recording system using the same according to the present invention include (a) an encoder for converting data into data symbols, and (b) a decoder for converting the decoding result into original data.

BRIEF DESCRIPTION OF THE DRAWINGS

FIGS. 1A and 1B are diagrams illustrating the configuration of a magnetic recording system to which the present invention is applied;

FIG. 3 is an illustration showing figures expressed in the decimal system, which figures are equivalent to elements of code words in an encoder;

FIG. 5 is an illustration showing the correspondence between data values and data symbol numbers in data encoding;

FIG. 7 is an illustration showing the correspondence between data values and data symbol numbers in a decoder by means of equivalent figures expressed in the decimal system;

FIG. 8 is an illustration showing the correspondence between data values and data symbol numbers in the decoder;

FIG. 12 is an illustration showing the appearance probability of symbol patterns with error occurrence potential.

DESCRIPTION OF THE PREFERRED EMBODIMENT

Figure 2:
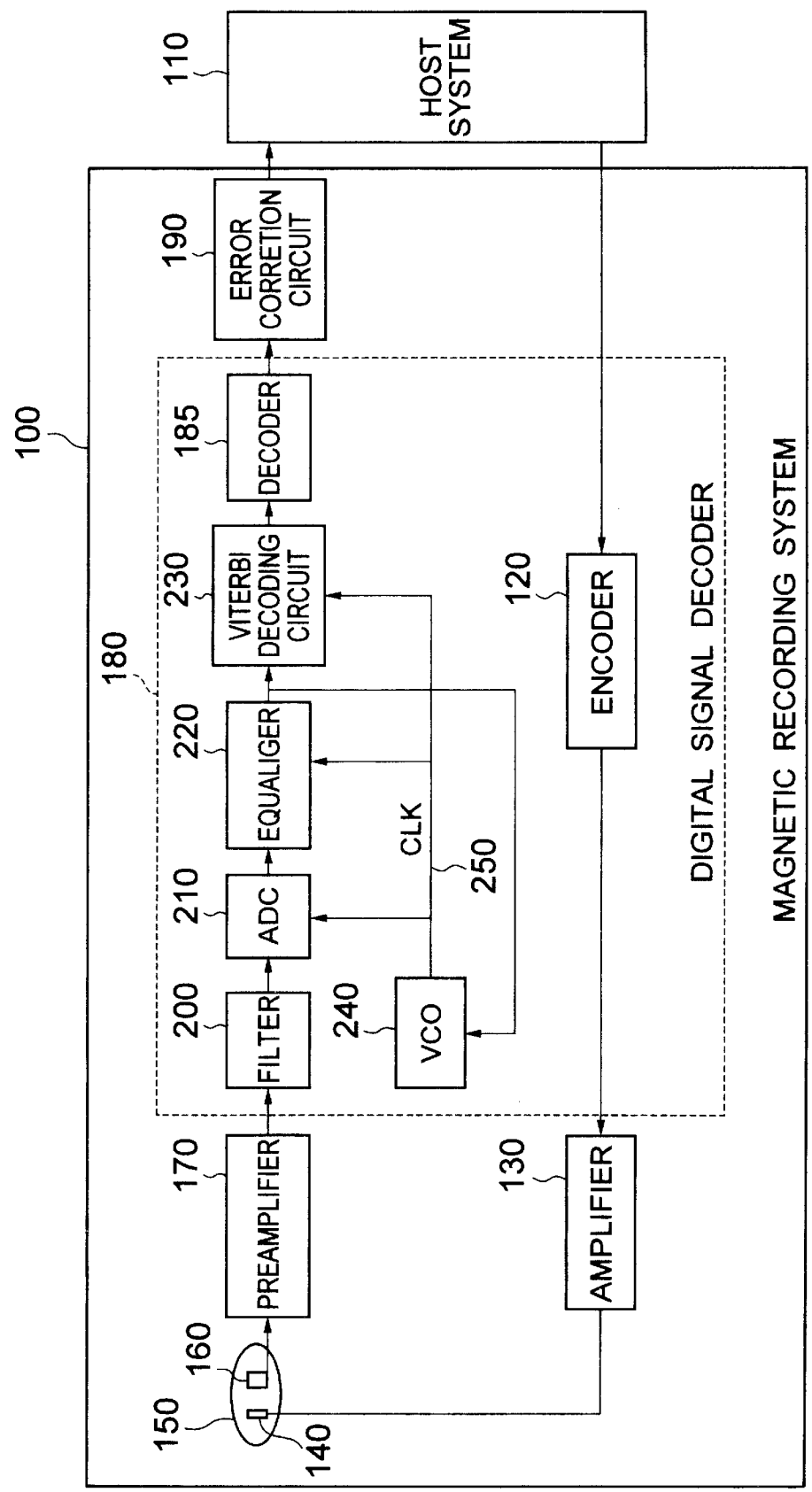
FIG. 2 is a schematic flow diagram of signals in a related-art magnetic recording system.

An embodiment of a recording system according to the present invention will be described with reference to the drawings. FIGS. 1A and 1B show a magnetic recording system using the present invention. An interior 10 of the magnetic recording system is constituted by a magnetic disk 20 in which data have been written, a spindle motor 30 for rotating the disk 20, a head 40 for reading data from the disk 20, an arm 35 for supporting the head 40, a voice coil motor 45 for moving the head 40, and a read/write amplifier 50 for amplifying signals from the head 40.

In addition, an electronic circuit portion 60 of the magnetic recording system is constituted by an interface 70 for connecting with an information processing system such as a host system or the like, an interface control circuit 75 for controlling input/output of the interface 70, a magnetic disk controller 80 for controlling delivery, format and so on of data, a microcomputer 85, a signal processing circuit 90 for processing signals from the read/write amplifier 50, a spindle motor control circuit 95 for controlling the spindle motor 30, and a voice coil motor control circuit 98 for controlling the voice coil motor 45.

The schematic flow of signals in the magnetic recording system to which the present invention is applied will be described with reference to FIG. 2. Although a digital signal decoder included in a system which can record and reproduce data will be described in this embodiment, the present invention is not limited to this, and it is also applicable to a digital signal decoder included in a data read-back only system or the like.

A magnetic recording system 100 not only records data supplied from a host system 110 such as a computer or the like onto recording media 150, but also reads the data recorded on the recording media 150 so as to output the read data to the host system 110. The magnetic recording system 100 has, for example, as shown in FIG. 2, an encoder 120, an amplifier 130 and a write head 140 as main components for writing data onto the recording media 150, and further has a read head 160, a preamplifier 170, a digital signal decoder 180, a decoder 185 and an error correction circuit 190 as main components for reading data.

In the digital signal decoder 180 to which the present invention is applied, signals read from the recording media 150 such as a magnetic disk or the like by the read head 160 are amplified by the preamplifier 170, and then subjected to elimination of high-frequency noise by means of a filter 200. Read-back signals from which high-frequency noise has been eliminated are converted into digital signals by an ADC (Analog/Digital Converter) 210, and thereafter equalized by an equalizer 220 for data decoding. Here, the equalizing means shaping the amplitude characteristic and phase characteristic of the read-back signals so as to make it easy to detect the read-back digital signals having analog values as their original digital signals having values of "1" or "0".

The equalized signals are detected and reproduced as digital signals by a Viterbi decoding circuit 230, and converted into their original data by the decoder 185. Using the output of the equalizer 220, a VCO 240 generates a clock signal CLK 250 for determining the operation timing of various portions.

In this embodiment, the aforementioned object of the present invention is attained in the aforementioned digital signal decoder 180 by using codes described below, in the encoder 120 and the decoder 185.

Generally, a code recorded in the recording system is constituted by data of 8-bit called one byte. In this embodiment, two bytes (16 bits) of data are converted into 17 bits of recorded data.

Figures 10, 11:
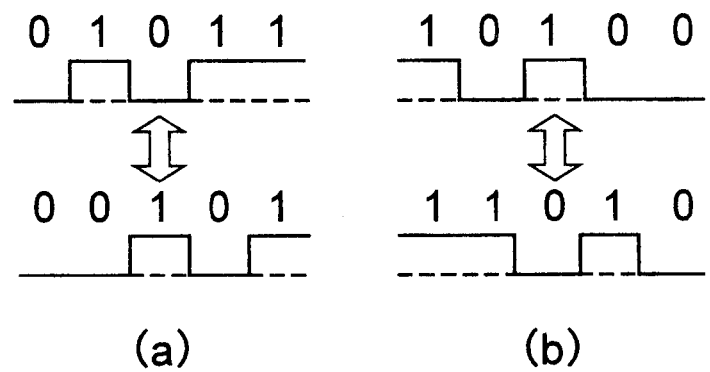
FIG. 10 is an illustration illustrating an example of error pattern in which the Euclidian distance is not larger than 8.
FIG. 11 is a diagram illustrating an example of error pattern in which the Euclidian distance is 6.

To consider applying a code having an expanded inter-symbol Euclidian distance to EEPRML, first, decoding error patterns of EEPRML will be made clear. Error patterns which are independent and in which the Euclidian distance is 8 or less are shown in FIG. 10. The error patterns are expressed by recording current (NRZ) in order that the error patterns should not depend on preceding. In addition, ( ) shows that error patterns in which the error pattern in parentheses are repeated one or more times have the same Euclidian distance.

It is understood that any error pattern in which the Euclidian distance is 8 or less is a pattern with three or more consecutive magnetic transitions, as shown in FIG. 10. Using this characteristic, MTR codes constitute recording data symbols from which all of code words with three or more magnetic transitions have been eliminated, so as to expand the minimum Euclidian distance to 10.

FIG. 11 shows error patterns in which the number of magnetic transitions is 3 and the Euclidian distance is 6. As is understood from FIG. 11, the magnetic transition position is shifted to either the right or the left by one bit in any error pattern. Therefore, if there is a sequence consisting of four consecutive magnetic transitions after three consecutive magnetic transitions are shifted to the right or the left by one bit, one of the error patterns shown in FIG. 11 is absent from the code words, so that the Euclidian distance can be expanded to 10. Using this characteristic, GTMR codes increase the number of code words to thereby realize a high data encoding rate. A 16/17 rate MTR code according to the present invention allows error events the minimum Euclidian distance of which is 6 as shown in FIG. 11, while the MTR code can eliminate all the independent error events the Euclidian distance of which is 8.

FIG. 12 shows the probability that there will appear a data symbol pattern in which an error can occur in an EEPRML channel when the code of this embodiment is used, in comparison with that when a 16/17 rate (0, 6/6) GCR (group coded recording) code is used. In the code of this embodiment, dominant error patterns are limited to two, a and d. Further, the probability that there will appear a pattern the Euclidian distance of which is 6 and the easiest to produce an error is reduced to about ¼ in comparison with that of the 16/17 rate (0, 6/6) GCR code. This characteristic is the greatest main reason that the data decoding rate can be reduced when the code according to the present invention is used in an EEPRML channel.

Figure 4:
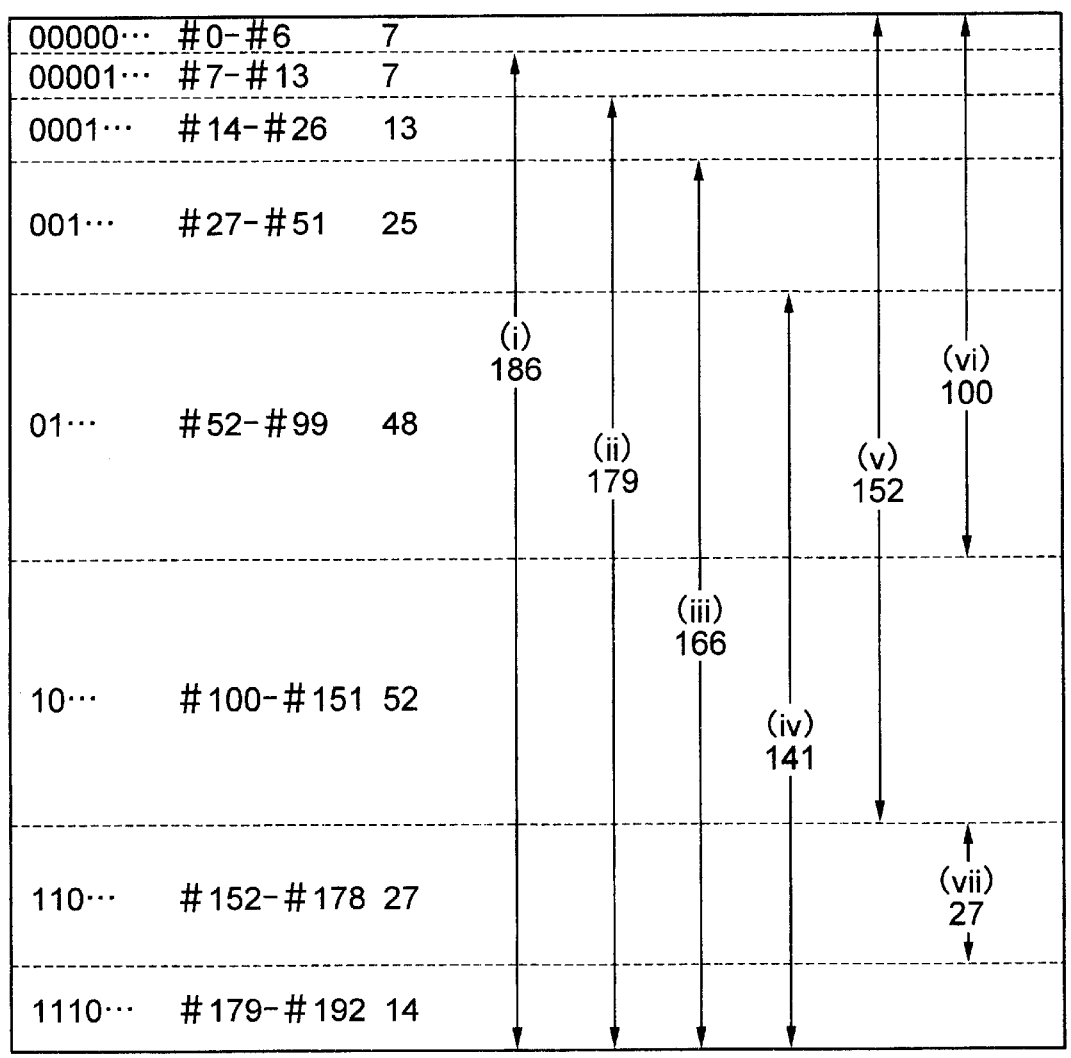
FIG. 4 is an illustration showing classification for elements of code words used for data encoding.

A code word is formed so as to have at most 10 consecutive bits of 0 and at most 3 consecutive bits of 1 in any portion of the code. First, consider 8-bit codes before code words are arranged. When three consecutive bits of 1 are allowed at the heads of code words, and at most two bits of 1 are consecutive in the tails of the code words, the number of possible code words is 193, which are expressed in the decimal system, as shown in FIG. 3. The code words shown in FIG. 3 are classified as shown in FIG. 4. The conditions of code classes (i) to (vii) and the numbers of code words belonging thereto are as follows.

| | | |
|---|---|---|
| (i) | Four or less consecutive bits of 0 at the head | 186 pieces |
| (ii) | Three or less consecutive bits of 0 at the head | 179 pieces |
| (iii) | Two or less consecutive bits of 0 at the head | 166 pieces |
| (iv) | One or less consecutive bits of 0 at the head | 141 pieces |
| (v) | One or less consecutive bits of 1 at the head | 152 pieces |
| (vi) | 0 at the first bit | 100 pieces |
| (vii) | 110 at the head | 27 pieces |

These seven classes of codes are combined to constitute code words with run length of ten or less. Inverted codes corresponding to the seven classes of codes will be expressed like (i').

Code words with a run length of 10 or less, with at most two consecutive bits of 1 at the head and at the tail, and with at most three consecutive bits of 1 inside the code words can be constituted by the following combinations. Here, any figure between ( ) and ( ) designates a value of a bit to be inserted at the center when 16 bits of data are converted into 17 bits of data.

| | | |
|---|---|---|
| (a) | (i')0(i) | 186 × 186 = 34596 pieces |
| (b) | (00000000)0(iv) | |
| | (iv')0(00000000) | 141 × 2 = 282 pieces |
| (c) | (10000000)0(iii) | |
| | (iii')0(00000001) | 166 × 2 = 332 pieces |
| (d) | (01000000)0(ii) | |
| | (11000000)0(ii) | |
| | (ii')0(00000010) | |
| | (ii')0(00000011) | 179 × 4 = 716 pieces |
| (e) | (00100000)0(i) | |
| | (10100000)0(i) | |
| | (01100000)0(i) | |
| | (i')0(00000100) | |
| | (i')0(00000101) | |
| | (i')0(00000110) | 186 × 6 = 1116 pieces |
| (f) | (v)1(v) | 152 × 152 = 23104 pieces |
| (g) | (vi')1(vii) | |
| | (vii')1(vi) | 27 × 100 × 2 = 5400 pieces |

The number of code words is 65,546 in total, and this number is beyond 65,536 code words required for encoding 16-bit data.

These code words are allocated to data. The allocation is made so that symmetry is established between the first byte (#0 byte) and the second byte (#1 byte) of two-byte data, as much as possible.

In the first step, first, code words belonging to (a) and a part of cord words belonging to (f) are allocated as follows. Then there remain 14,560 data and 14,570 code words. In Table 1, the numbers of code words are corresponding to those shown in FIG. 3, and (a) to (f) designates the combinations of the above-mentioned code words.

TABLE 1

| | | | Code Number | | |
|---|---|---|---|---|---|
| User Data Value | | | Center | | |
| #0_byte | #1_byte | | #0_byte | bit | #1_byte |
| 0–185 | 0–185 | (a) | #7–#192 | 0 | #7–#192 |
| 186–255 | 186–255 | (f) | #82–#151 | 1 | #82–#151 |
| 185–255 | 104–185 | (f) | #82–#151 | 1 | #0–#81 |
| 104–185 | 186–255 | (f) | #0–#81 | 1 | #82–#151 |
| Rest 0–103 | 186–255 | (b) | #0 | 0 | #52–#192 |
| 186–255 | 0–103 | (b) | #52–#192 | 0 | #0 |

TABLE 1-continued

| User Data Value | | | Code Number | | |
|---|---|---|---|---|---|
| #0_byte | #1_byte | | #0_byte | Center bit | #1_byte |
| | | (c) | #1 | 0 | #27–#192 |
| | | (c) | #27–#192 | 0 | #1 |
| | | (d) | #2, #3 | 0 | #14–#192 |
| | | (d) | #14–#192 | 0 | #2, #3 |
| | | (e) | #4, #5, #6 | 0 | #7–#192 |
| | | (e) | #7–#192 | 0 | #4, #5, #6 |
| | | (f) | #0–#81 | 1 | #0–#81 |
| | | (g) | #152–#178 | 1 | #0–#99 |
| | | (g) | #0–#99 | 1 | #152–#178 |
| 7280*2 = 14560 | | | 6724 + 2446 + 5400 = 14570 | | |

In the second step, next, as shown in Table 2, code words belonging to (g) and the rest of the code words belonging to (f) are allocated to the rest of the data.

TABLE 2

| | User Data Value | | | Code Number | | |
|---|---|---|---|---|---|---|
| | | | | | Center | |
| | #0_byte | #1_byte | | #0byte | bit | #1_byte |
| | 0–99 | 186–212 | (g) | #0–#99 | 1 | #152–#178 |
| | 186–212 | 0–99 | (g) | #152–#178 | 1 | #0–#99 |
| | 0–40 | 213–253 | (f) | #0–#40 | 1 | #0–#40 |
| | 41–81 | 213–253 | (f) | #41–#81 | 1 | #0–#40 |
| | 213–253 | 0–40 | (f) | #0–#40 | 1 | #41–#81 |
| | 213–253 | 41–81 | (f) | #41–#81 | 1 | #41–#81 |
| Rest | 0–81 | 254–255 | (b) | #0 | 0 | #52–#192 |
| | 82–99 | 213–253 | (b) | #52–#192 | 0 | #0 |
| | 82–99 | 254–255 | (c) | #1 | 0 | #27–#192 |
| | 100–103 | 213–255 | (c) | #27–#192 | 0 | #1 |
| | 100–103 | 186–212 | (d) | #14–#192 | 0 | #2, #3 |
| | 254–255 | 0–81 | (d) | #2, #3 | 0 | #14–#192 |
| | 213–253 | 82–99 | (e) | #4, #5, #6 | 0 | #7–#192 |
| | 254–255 | 82–99 | (e) | #7–#192 | 0 | #4, #5, #6 |
| | 213–255 | 100–103 | | | | |
| | 186–212 | 100–103 | | | | |
| | 1218*2 = 2436 | | | | 2446 | |

In the third step, next, the remaining code words belonging to (c) are allocated to the rest of the data as shown in Table 3.

TABLE 3

| User Data Value | | | Code Number | | |
|---|---|---|---|---|---|
| #0_byte | #1_byte | | #0_byte | Center bit | #1_byte |
| 0–81 | 254 | (c) | #27–#108 | 0 | #1 |
| 0–81 | 255 | (c) | #109–#190 | 0 | #1 |
| 254 | 0–81 | (c) | #1 | 0 | #27–#108 |
| 255 | 0–81 | (c) | #1 | 0 | #109–190 |
| 82–99 | 213–255 | (b) | #0 | 0 | #52–#192 |
| 100–103 | 186–255 | (b) | #52–#192 | 0 | #0 |
| 213–255 | 82–99 | (d) | #14–#192 | 0 | #2, #3 |
| 186–255 | 100–103 | (d) | #2, #3 | 0 | #14–#192 |
| | | (e) | #4, #5, #6 | 0 | #7–#192 |
| | | (e) | #7–#192 | 0 | #4, #5, #6 |
| 1218*2 = 2108 | | | | 2114 | |

In the fourth step, next, of the remaining code words, code words belonging to (d) are allocated to the rest of the data as shown in Table 4.

TABLE 4

| User Data Value | | | Code Number | | |
|---|---|---|---|---|---|
| #0_byte | #1_byte | | #0_byte | Center bit | #1_byte |
| 94–95 | 213–255 | (d) | #2, #3 | 0 | #14–#56 |
| 96–97 | 213–255 | (d) | #2, #3 | 0 | #57–#99 |
| 98–99 | 213–255 | (d) | #2, #3 | 0 | #100–#142 |
| 100–101 | 186–235 | (d) | #2, #3 | 0 | #143–#192 |
| 213–255 | 94–95 | (d) | #14–#56 | 0 | #2, #3 |
| 213–255 | 96–97 | (d) | #57–#99 | 0 | #2, #3 |
| 213–255 | 98–99 | (d) | #100–#142 | 0 | #2, #3 |
| 186–235 | 100–101 | (d) | #143–#192 | 0 | #2, #3 |
| 82–93 | 213–255 | (b) | #0 | 0 | #52–#192 |
| 100–101 | 236–255 | (b) | #52–#192 | 0 | #0 |
| 102–103 | 186–255 | (e) | #4–#6 | 0 | #7–#192 |
| | | (e) | #7–#192 | 0 | #4–#6 |
| 1392 | | | | 1398 | |

In the fifth step, finally, the remaining code words belonging to (b) and (e) are allocated to the rest of the data as shown in Table 5.

TABLE 5

| User Data Value | | | Code Number | | |
|---|---|---|---|---|---|
| #0_byte | #1_byte | | #0_byte | Center bit | #1_byte |
| 100–101 | 236–249 | (e) | #4–#5 | 0 | #179–#192 |
| 100 | 250–255 | (e) | #6 | 0 | #179–#184 |
| 101 | 250–255 | (e) | #6 | 0 | #179–#184 |
| 102 | 186–255 | (b) | #0 | 0 | #185–#190 |
| 103 | 186–255 | (b) | #0 | 0 | #122–#191 |
| 236–249 | 100–101 | (e) | #179–#192 | 0 | #4–#5 |
| 250–255 | 100 | (e) | #179–#184 | 0 | #6 |
| 250–255 | 101 | (e) | #185–#190 | 0 | #6 |
| 186–255 | 102 | (b) | #52–#121 | 0 | #0 |
| 186–255 | 103 | (b) | #122–#191 | 0 | #0 |

In conclusion, data encoding can be performed by 40 combinations of two-byte data as shown in FIG. 5. In FIG. 5, the numbers of data to be encoded are listed in accordance with the translation table of FIG. 3 for data encoding. Therefore, for data encoding, first, judgment is made as to which range of user data shown in FIG. 5 two bytes of data x0 and x1 belong to. After the right values y0 and y1 are obtained, No. x0+y0 and x1+y1 codes are sought from FIG. 3 respectively. Finally, 0 or 1 is inserted as a central bit in accordance with FIG. 5.

When preceding is performed along the operator $1/(1+D)$, there occurs such an event that the decoding result of Viterbi decoding is not fixed in decoding data if a code with a bit sequence of '1100' being repeated is used in an EPRML (External PRML) channel with a response of $(1-D)(1+D)3$. To eliminate such a bit sequence, in the aforementioned procedure of data encoding, the following four code words including the '1100' bit pattern may be replaced by suitable ones of 10 code words which are not used in the aforementioned data encoding. The code words including the '1100' bit sequence to be replaced are the following four.

00110011001100110

01100110011001100

11001100110011001

10011001100110011 (Expression 1)

Instead of replacing of these four code words, the length of the repeated '1100' bit sequence may be reduced by performing the following conversion to an connecting portion between one code and the next code.

...110011, 001100... → ...110111, 001100...  (Expression 2)
...100110, 011001... → ...101100, 111001...
...001100, 110011... → ...001100, 111011...
...011001, 100110... → ...010111, 001110...

That is, when the '1100' bit sequence is repeated in the portion where the first code and the second code are connected, the bit sequence is converted so that the least significant 3 bits of the first code word or the most significant 3 bits of the second code word take 1 respectively. There is no code word having '111' in the most significant 3 bits or the least significant 3 bits of any code word in the data coding method described in this embodiment. Therefore, if any of the bit patterns in the right of the expression 3 appears in a connection portion between any code word and the next code word after Viterbi data encoding, rate 16/17 codes may be decoded after the bit pattern is inverted into the corresponding bit pattern in the left.

When data encoding is performed in the above-mentioned manner, four bits of 1 will be consecutive in a connection portion between one 17-bit code word and the next 17-bit code word if the least significant two bits of the former are 1 respectively and the most significant two bits of the latter are 1 respectively. The following conversion is performed in a connection portion between any code word and the next code word so that such a bit sequence is translated into a code in which three or more bits of 1 are not consecutive.

...0011, 1100... → ...0111, 0100...  (Expression 3)
...0011, 1101... → ...0111, 0101...
...1011, 1100... → ...1010, 1110...
...1011, 1101... → ...1000, 1110...

That is, when the least significant two bits of the first code word are 1 respectively and the most significant two bits of the second code word are 1 respectively, the bit sequence is converted so that the least significant 3 bits of the first code word or the most significant 3 bits of the second code word take 1 respectively. There is no code word having '111' in the most significant 3 bits or the least significant 3 bits of any code word in the data coding method described in this embodiment. In addition, there is no repetition between the conversion of the expression 2 and the conversion of the expression 3. Therefore, if any of the bit patterns in the right of the expression 3 appears in the most significant 3 bits or the least significant 3 bits of any code word after Viterbi data encoding, rate 16/17 codes may be decoded after the bit pattern is inverted into the corresponding bit pattern in the left.

Further, when data encoding is performed in the above-mentioned manner, run length of 0 will reach at most 20 if the least significant 10 bits of a 17-bit code word are 0 respectively and the most significant 10 bits of the next 17-bit code word are 0 respectively. In order to solve such a long run length, the following conversion is performed in a connection portion between any code word and the next code word.

...0000, 0000... → ...0010, 1110...  (Expression 4)
...0000, 0001... → ...0000, 1110...
...0000, 0010... → ...0111, 0010...
...0000, 0011... → ...0111, 0110...
...1000, 0000... → ...0111, 0000...
...0100, 0000... → ...0100, 1110...
...1100, 0000... → ...0110, 1110...

That is, when all the least significant 4 bits of the first code word are 0, or all the most significant 4 bits of the second code word are 0, the bit sequence is converted so that the least significant 3 bits of the first code word or the most significant 3 bits of the second code word take 1 respectively. There is no code word having '111' in the most significant 3 bits or the least significant 3 bits of any code word in the data coding method described in this embodiment. In addition, there is no repetition among the conversion of the expression 2, the conversion of the expression 3, and the conversion of the expression 4. Therefore, if any of the bit patterns in the right of the expression 4 appears after Viterbi data encoding, rate 16/17 codes may be decoded after the bit pattern is inverted into the corresponding bit pattern in the left.

There is a case where the consecutive 0 number is increased by only 1 by the above-mentioned conversion in any connection portion between code words. Therefore, at most 11 bits of 0 are consecutive in sequential code words recorded and subjected to the conversion in their connection portions.

A circuit of the encoder 120 will be described with reference to FIG. 6. First, 8-bit (1-byte) data x0 is supplied to a delay element (abbreviated to D) 360 and a comparator 300. The comparator 300 makes a comparison to make judgment as to which range corresponding to FIG. 4 the value of the data x0 belongs to. Specifically, the value of the data x0 is compared with the following 20 constant values.

41, 82, 85, 88, 91, 94, 96, 98, 100, 101, 102, 103, 104, 186, 213, 235, 236, 249, 250, 254

Data x1 is supplied to the comparator 300 one clock later than the data x0, and compared with the aforementioned 20 constant values in the same manner as the data x0. The comparison results for the data x0 and the data x1 are supplied to a decoder 310 in response to the next clock. The decoder 310 outputs signed 8-bit values y0 and y1 shown in FIG. 4, and one bit as the value of the central bit. With the timing recovered by delay elements 363 and 365, the data x0 and x1 and the outputs y0 and y1 of the decoder are added in adders (abbreviated to ADD) 320 and 330 respectively to thereby generate the numbers of 8-bit codes for the first half portion and the second half portion of a 17-bit code. First, x0+y0 is selected in a selector (abbreviated to SEL) 340, and 8-bit data in the table (expressed in the decimal system) shown in FIG. 3 is outputted by a decoder 350.

In response to the next clock, x1+y1 is selected by the selector 340, and the decoder 350 outputs 8-bit data corresponding to x1+y1. The data of the central one bit and the 8-bit data corresponding to each of x0+y0 and x1+y1 are stored in a latch (abbreviated to LT) 370 at the timing recovered by delay elements 368 and 367. The data in the latch 370 is transmitted to a latch 375 and a latch 376 sequentially in response to every clock, and 17-bit data is supplied from the latch 376 as recorded data. The most significant four bits of the 17-bit data stored in the latch 375, and the least significant one bit of the 17-bit data stored in the latch 376 are connected to a bit correction circuit 380. If the respective bits satisfy the conditions shown in the left of the expression 2, the data pattern in the latches 375 and 376 is converted into the corresponding pattern in the right of the expression 2. Also in the case of data patterns shown in the expression 3, similar data conversion is executed along the expression 3.

Figure 6:
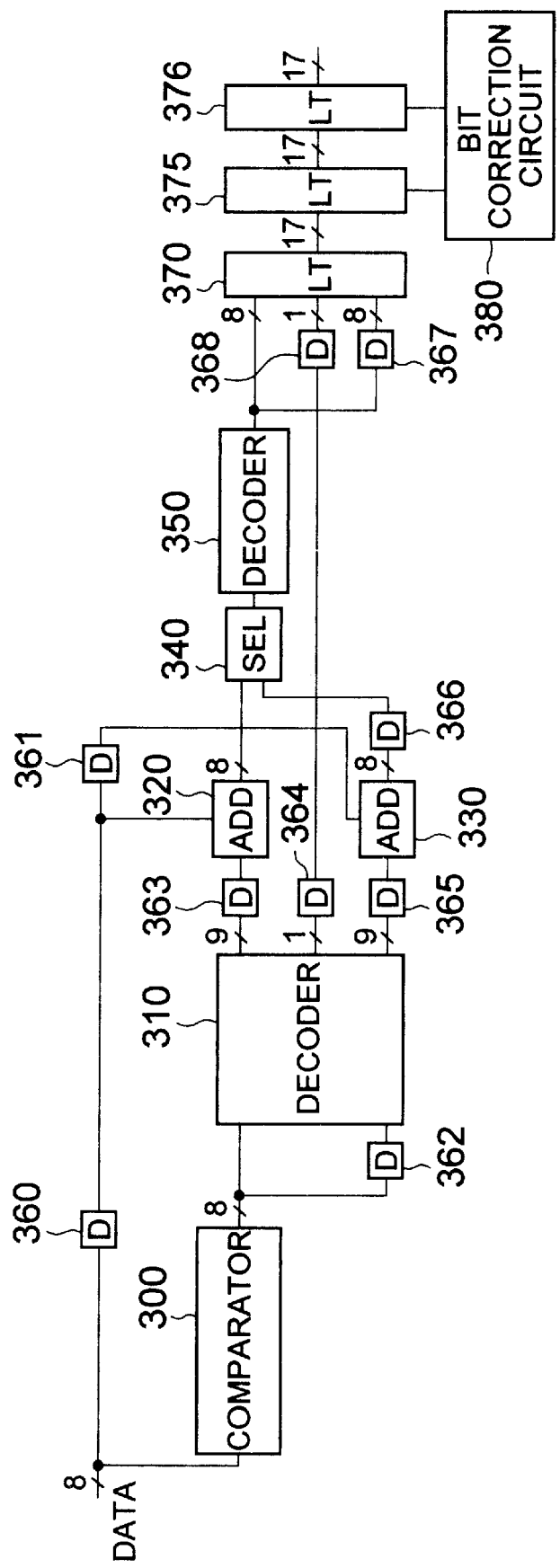
FIG. 6 is a diagram illustrating an embodiment of an encoder according to the present invention.

One comparator 300 and one decoder 310 are used in common for the most significant 8 bits and the least significant 8 bits of data in the embodiment of the encoder shown in FIG. 6. However, of course, comparators and decoders may be provided separately.

Next, description will be made about the decoder 185. The decoder 185 converts 17-bit outputs of a Viterbi decoding circuit 230 into original 16-bit (2-byte) data. First, the decoder 185 divides the 17-bit data into s0 (8 bits of the first half), one bit at the center, and s1 (8 bits of the second half), and translates the values of s0 and s1 in accordance with the table of FIG. 8. FIG. 8 is a table for converting the values s0 and s1 obtained from decoded data into data numbers z0 and z1 in accordance with the table shown in FIG. 7, respectively. In FIG. 7, data not included in FIG. 7 are designated as 255 in the decimal system. From the converted data z0 and z1 and the 1-bit data at the center, correction values r0 and r1 are obtained in accordance with FIG. 8. Specifically, the data z0 and z1 are compared with the following 25 constant values, respectively, and the correction values r0 and r1 are obtained from a range of hit values in FIG. 8.

1, 2, 4, 6, 7, 14, 27, 41, 50, 52, 57, 82, 93, 100, 109, 122, 136, 143, 152, 179, 185, 186, 191, 192, 193

A conversion corresponding to the conversion from y0 and y1 to x0 and x1 in FIG. 5 is executed by adding the correction values r0 and r1 to the values z0 and z1 respectively. Thus r0+z0 becomes original first data, and r1+z1 becomes original second data.

The configuration of the decoder 185 will be described with reference to FIG. 9. The decoding result transmitted from the decoding circuit 230 is supplied to a latch 490. The data in the latch 490 is supplied to a latch 400 through a latch 491. In the latches 490 and 491, if the lower bits in the latch 490 and the upper bits in the latch 491 coincide with the change of the bit pattern in the encoder 120, the bit pattern conversion in the latches 490 and 491 is performed in opposition to that in the encoder 120. Upper 8 bits in the latch 400 are selected by a selector 410 and sent to a decoder 420. In the decoder 420, the value of the upper 8 bits is decoded in accordance with FIG. 7, and the decoded value is stored in a latch 485. In response to the next clock, the value in the latch 485 is compared with the aforementioned 25 constant values, and held by a delay element 483. The data of lower 8 bits in the latch 400 are delayed by one clock through a delay element 480, sent to the selector 410, and then decoded in the decoder 420 in accordance with FIG. 7. The decoding result is sent to a comparator 430 through the latch 485, and compared with the aforementioned 25 constant values. The output of the comparator 430 derived from the upper 8 bits and delayed by one clock through the delay element 483, the output of the comparator 430 derived from the lower 8 bits, and one bit at the center in the latch 400 the timing of which bit is recovered by delay elements 481 and 482, are supplied to a decoder 440, so that correction values r0 and r1 are calculated in accordance with FIG. 8. The output of the decoder 440 is added to the output of the decoder 420 the timing of which output is recovered by a delay element 484. That is, z0+r0 for the upper 8 bits is calculated in an adder 450, while z1+r1 for the lower 8 bits is calculated in an adder 460. Stored once in a latch 470, the outputs of the adder 450 and the adder 460 are then sent, as 16-bit data, to the error correction circuit 190.

Figure 9:
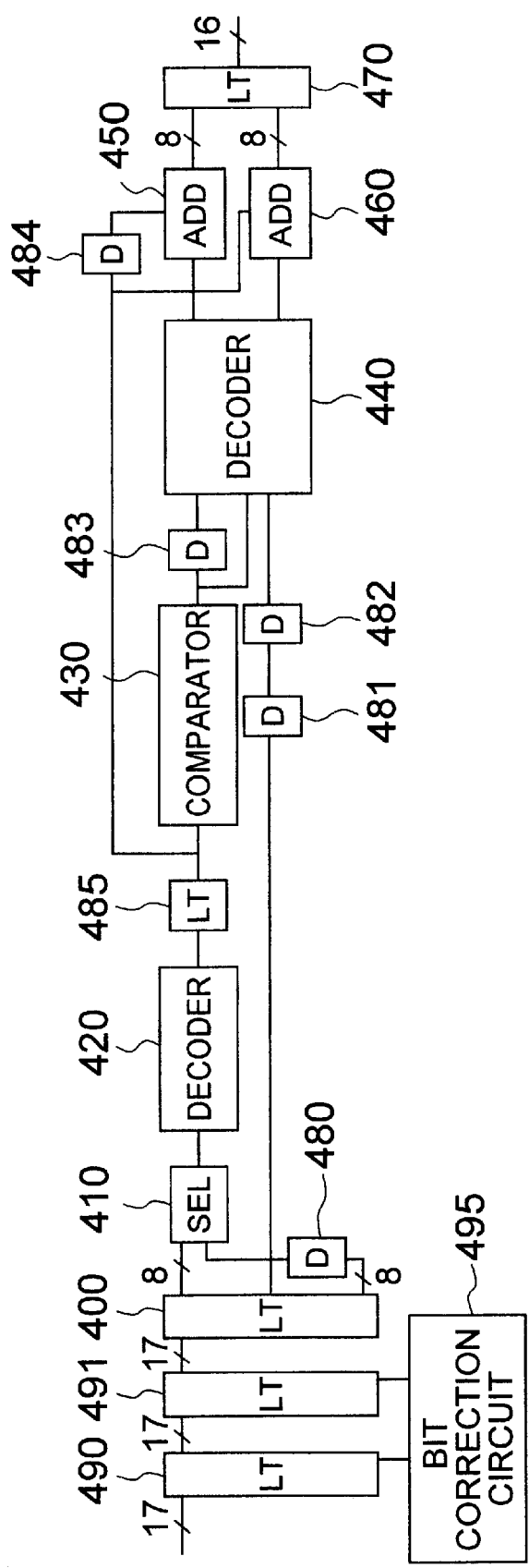
FIG. 9 is a diagram illustrating an embodiment of a decoder according to the present invention.

One decoder 420 and one comparator 430 are used in common for the upper 8 bits and the lower 8 bits of data in the embodiment of the decoder shown in FIG. 9. However, not to say, comparators and decoders may be provided separately.

Although description was made about a magnetic recording system by way of example in this embodiment, the invention is, not to say, also applicable to a photomagnetic recording system or a read-back only system quite in the same manner.

As has been described, according to the present invention, it is possible to provide a data encoding method particularly suitable to an NRZ (Non-Return to Zero) system or the like.

What is claimed is:

1. A data encoding method in a digital data recording apparatus connected to a host system and having a recording medium, comprising the steps of:

receiving 16-bit data;

generating a 17-bit code word from said 16-bit data, in which code word a number of consecutive bits of 1 is equal to or less than 3, and a number of consecutive bits of 0 is equal to or less than 10.

2. A data encoding method according to claim 1;

wherein the number of consecutive bits of 1 is 2 or less in the most significant bit sequence and the least significant bit sequence of the code word.

3. A data encoding method according to claim 1;

wherein, when, in a connecting portion where a first code word is followed by a second code word in a sequence of code words each successively generated from the step of generating, a least significant two bits of said first code word is '11', and a most significant two bits of the second code word is '11', 8 bits constituted by a least significant 4 bits of said first code word and a most significant 4 bits of said succeeding second code word are replaced by a bit string of '0111,0*' or '*0, 1110', wherein * is 1 or 0 so set to satisfy a restriction that the number of consecutive bits of 1 is reduced to three or less, so that the number of consecutive bits of 1 in said connecting portion is 3 or less.

4. A computer system comprising:

a host system;

a recording medium; and a digital signal decoder connected to said host system and said recording medium;

wherein said digital signal decoder receives 16-bit data, and generates 17-bit code word from said 16-bit data, in which code word a number of consecutive bits of 1 is equal to or less than 3, and a number of consecutive bits of 0 is equal to or less than 10.

5. A data recording apparatus comprising:

an interface coupled to a host system;

an encoder which encodes M-bit data received by said interface and generates a 17-bit code word from said 16-bit data, wherein in said code word a number of consecutive bits of 1 is equal to or less than 3, and a number of consecutive bits of 0 is equal to or less than 10; and a recording medium onto which said 17-bit code word is recorded.

* * * * *